(12) United States Patent
Fairhurst et al.

(10) Patent No.: US 9,218,990 B2
(45) Date of Patent: Dec. 22, 2015

(54) METHOD AND APPARATUS FOR HOLDING A PLURALITY OF SUBSTRATES FOR PROCESSING

(75) Inventors: John Robert Fairhurst, Plaistow, NH (US); Jeffrey E. Krampert, Topsfield, MA (US); Richard J. Hertel, Boxford, MA (US); Edward MacIntosh, Amesbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 1067 days.

(21) Appl. No.: 13/268,123

(22) Filed: Oct. 7, 2011

(65) Prior Publication Data

US 2013/0089403 A1    Apr. 11, 2013

(51) Int. Cl.
*H01L 21/687* (2006.01)
*H01L 21/67* (2006.01)

(52) U.S. Cl.
CPC .......... *H01L 21/67* (2013.01); *H01L 21/68728* (2013.01); *H01L 21/68764* (2013.01); *H01L 21/68771* (2013.01)

(58) Field of Classification Search
CPC ............ H01L 21/67333; H01L 21/677; H01L 21/67772; B25B 5/145
USPC ........... 29/281.1; 269/10, 232, 233, 235, 287, 269/289 R, 9, 903; 206/710, 712
See application file for complete search history.

(56) References Cited

U.S. PATENT DOCUMENTS

| | | | | |
|---|---|---|---|---|
| 351,871 A * | 11/1886 | Lampert | ............................. | 81/6 |
| 562,516 A * | 6/1896 | Evans | ................................. | 81/6 |
| 1,705,582 A * | 3/1929 | May | ........................... | 248/316.2 |
| 2,094,225 A * | 9/1937 | Tuttle | ............................. | 82/172 |
| 4,473,455 A * | 9/1984 | Dean et al. | ............... | 204/298.15 |
| 4,703,920 A * | 11/1987 | Grabbe et al. | ................... | 269/37 |
| 4,810,616 A * | 3/1989 | Grabbe et al. | ...................... | 430/269 |
| 4,817,556 A * | 4/1989 | Mears et al. | .................. | 118/503 |
| 5,040,484 A * | 8/1991 | Mears et al. | .................. | 118/503 |
| 5,253,411 A * | 10/1993 | DiNapoli et al. | ............... | 29/559 |
| 5,352,249 A * | 10/1994 | Vollaro | ......................... | 29/25.01 |
| 5,501,436 A * | 3/1996 | Miller | .............................. | 269/47 |
| 5,517,059 A * | 5/1996 | Eytcheson et al. | ............. | 257/699 |
| 5,533,243 A * | 7/1996 | Asano | .......................... | 29/25.01 |
| 5,700,297 A * | 12/1997 | Vollaro | ........................ | 29/25.01 |
| 5,989,342 A * | 11/1999 | Ikeda et al. | ..................... | 118/52 |
| 6,231,038 B1 * | 5/2001 | Keyser et al. | .................. | 269/287 |
| 6,262,582 B1 * | 7/2001 | Barringer et al. | ......... | 324/756.01 |
| 6,328,296 B2 * | 12/2001 | Tyveleijn | ....................... | 269/297 |
| 6,343,784 B1 * | 2/2002 | Jourde et al. | ................... | 269/287 |
| 6,378,857 B1 * | 4/2002 | Taylor | .............................. | 269/47 |
| 6,427,313 B2 * | 8/2002 | Ishitani et al. | ................... | 29/559 |

(Continued)

*Primary Examiner* — Lee D Wilson
*Assistant Examiner* — Jamal Daniel

(57) ABSTRACT

A substrate carrier includes a carrier plate, a cover plate and a plurality of substrate support slots. The carrier plate has recesses for receiving substrates. A sidewall of each recess includes protrusions for engaging the OD of a substrate. The cover plate is rotatable and has a cam on an undersurface. The cam is enagageable with a lateral slot in each of a plurality of substrate supports of the carrier plate. Rotating the cover plate causes the cam to move the substrate supports, one by one, so a substrate engaging end of the substrate support moves away from an associated substrate recess. A substrate is loaded into the recess, whereupon the cover plate is rotated further so the cam disengages from the lateral slot. The substrate supports are biased to engage the OD of the substrate to lock the substrate within the recess. Other embodiments are described and claimed.

14 Claims, 12 Drawing Sheets

(56) References Cited

U.S. PATENT DOCUMENTS

| | | | |
|---|---|---|---|
| 6,442,818 B1 * | 9/2002 | Kay et al. | 29/281.1 |
| 6,446,951 B2 * | 9/2002 | Nuxoll et al. | 269/118 |
| 6,761,362 B2 * | 7/2004 | Noguchi | 279/106 |
| 6,764,272 B1 * | 7/2004 | Nuxoll et al. | 414/754 |
| 6,776,887 B2 * | 8/2004 | Roberts et al. | 204/298.15 |
| 6,996,898 B2 * | 2/2006 | Peckham et al. | 29/830 |
| 7,032,287 B1 * | 4/2006 | Spady et al. | 29/559 |
| 7,107,672 B2 * | 9/2006 | Onitsuka et al. | 29/832 |
| 7,284,760 B2 * | 10/2007 | Siebert et al. | 279/4.12 |
| 7,731,201 B2 * | 6/2010 | Murata et al. | 279/114 |
| 8,152,150 B2 * | 4/2012 | Li et al. | 269/305 |
| 8,220,788 B2 * | 7/2012 | Lube | 269/55 |
| 8,550,520 B2 * | 10/2013 | Fairhurst et al. | 294/93 |
| 8,628,069 B2 * | 1/2014 | Lee | 269/55 |
| 8,746,666 B2 * | 6/2014 | Hertel et al. | 269/47 |
| 8,910,375 B2 * | 12/2014 | Nakai et al. | 29/740 |
| 8,931,772 B2 * | 1/2015 | Phillips | 269/317 |
| 2008/0157455 A1 * | 7/2008 | Lester et al. | 269/287 |
| 2011/0089079 A1 * | 4/2011 | Lo | 206/711 |
| 2012/0139176 A1 * | 6/2012 | Di Stefano | 269/287 |
| 2012/0280442 A1 * | 11/2012 | Hertel et al. | 269/47 |
| 2013/0089395 A1 * | 4/2013 | Fairhurst et al. | 414/222.01 |
| 2014/0030048 A1 * | 1/2014 | Kosuge et al. | 414/225.01 |

* cited by examiner

METHOD AND APPARATUS FOR HOLDING A PLURALITY OF SUBSTRATES FOR PROCESSING

BACKGROUND OF THE INVENTION

1. Field of the Invention

Embodiments of the present disclosure relate to the field of device manufacturing. More particularly, the present disclosure relates to an improved method and apparatus for holding multiple substrates during ion implantation or other substrate processing steps.

2. Discussion of Related Art

Attempts have been made to automate the handling and transfer of thin substrates during ion implantation, sputter coating and other processes both for preventing contamination, abrasion or damage to the substrates and for achieving a high throughput in terms of the number of substrates processed per unit time. Often, substrate cassettes are provided to hold a plurality of discs in vertically facing alignment.

An automated substrate transfer system may be used to remove substrates from the cassette and to place the cassette in a container for transfer to a processing chamber where one or more deposition, implantation or other treatment processes can be performed. A problem with current substrate transfer containers is that they typically contact a portion of the substrate face. This is undesirable because substrate face damage can occur.

Thus, there is a need for an improved system and method for carrying substrates from a cassette to a processing chamber. The system and method should provide consistent and reliable engagement of a substrate to minimize the chance for damage to occur to the substrate, either through dropping, through contact with of the substrate face, or through engagement with other substrates.

SUMMARY OF THE INVENTION

The following presents a simplified summary in order to provide a basic understanding of some novel embodiments described herein. This summary is not an extensive overview, and it is not intended to identify key/critical elements or to delineate the scope thereof. Its sole purpose is to present some concepts in a simplified form as a prelude to the more detailed description that is presented later.

A method and device are disclosed for holding multiple substrates during ion implantation or other procedure without touching either face of the substrate. A substrate carrier is disclosed for carrying a substrate having an outside diameter (OD), and first and second substrate faces. The substrate carrier comprises a carrier plate having a substrate recess, a cover plate recess and a substrate support slot. The substrate recess may include a protrusion on a recess sidewall, where the protrusion includes an inset portion. A cover plate is rotatably disposed in the cover plate recess, and a substrate support is slidably disposed in the substrate support slot. The substrate support has a substrate engaging end and an actuation end. A spring may be disposed between the actuation end of the substrate support and an end wall of the substrate support slot to bias the substrate support toward the recess. The substrate engaging end and the inset portion of the protrusion can be configured to engage the OD of the substrate to lock the substrate within the recess.

A substrate carrier is disclosed for carrying a plurality of substrates having an outside diameter (OD). The substrate carrier comprises a carrier plate having a plurality of substrate recesses, each of the plurality of substrate recesses being configured to engage one of the plurality of substrates along the OD of the substrate. A cover plate may be rotatably engaged with the carrier plate. A plurality of substrate supports may be slidably disposed with respect to said carrier plate, each the plurality of substrate supports having a substrate engaging end that is movable into an associated one the plurality of substrate recesses to engage one of the plurality of substrates disposed therein.

A method is disclosed for supporting a plurality of substrates in a carrier, each of the substrates having an outside diameter (OD). The method comprises: positioning a substrate adjacent to a carrier having a plurality of recesses, the recesses having at least two protrusions disposed on a sidewall thereof, each of the protrusions having an inset portion for engaging an OD of an associated one of said plurality of substrates; moving a substrate support in a first direction with respect to an associated one of the plurality of recesses; inserting a selected one of the plurality of substrates in the recess such that the OD of said selected substrate is positioned adjacent the at least two protrusions; and moving the substrate support in a second direction with respect to the associated one of the plurality of recesses to contact the OD of the selected substrate with a substrate engaging end of the substrate support. Contacting the OD of the selected substrate presses the substrate OD into engagement with the inset portions of the at least two protrusions to lock the selected substrate between the substrate engaging end and the inset portions.

BRIEF DESCRIPTION OF THE DRAWINGS

For a better understanding of the present disclosure, reference is made to the accompanying drawings, which are incorporated herein by reference and in which.

DESCRIPTION OF EMBODIMENTS

Figure 1A:
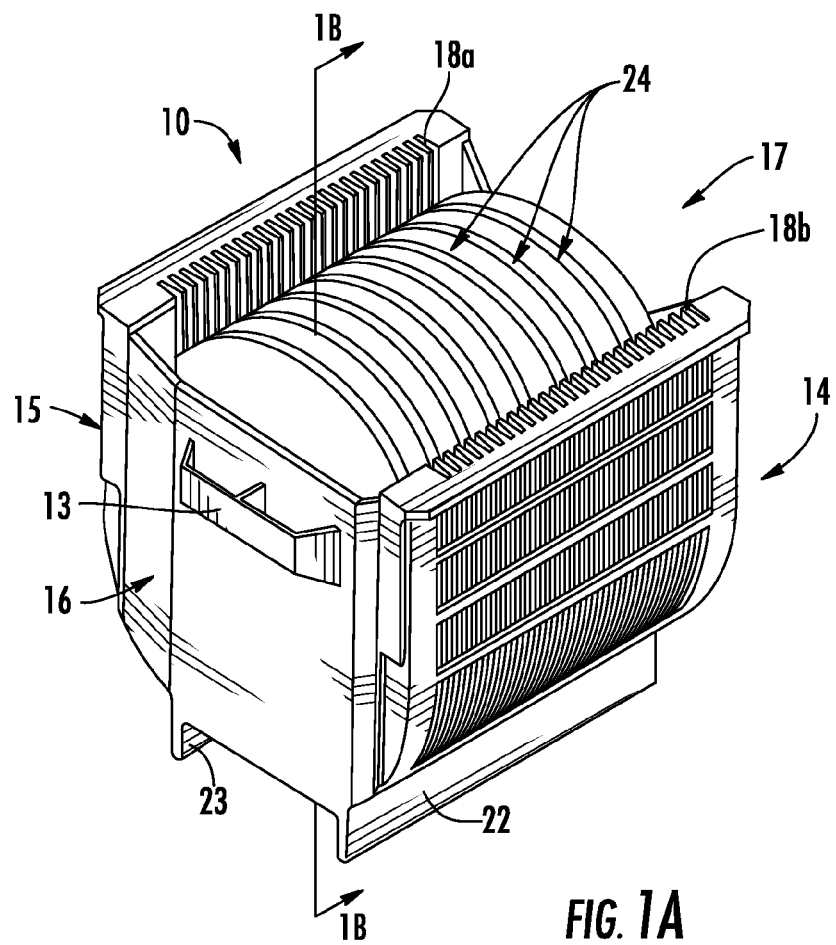
FIGS. 1A and 1B are perspective and cross-section views, respectively, of an exemplary substrate cassette.
Figure 1B:
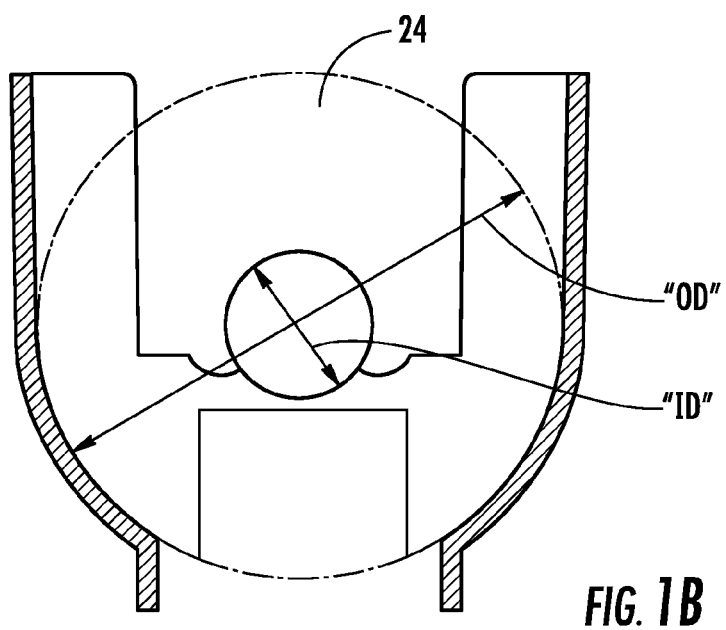

FIGS. 1A and 1B show an exemplary substrate cassette 10 containing a plurality of substrates 24. The cassette 10 may have front and back surfaces 16, 17, first and second sidewalls 14, 15, and pairs of left and right dividers 18a, 18b that receive the substrates. The cassette 10 functions to protect the substrates 24 during transport and storage, but is not typically used to hold the substrates 24 during any of the variety of processing steps to which substrates of the kind are often subjected. For example, the substrates 24 may be subject to one or more ion implantation steps or one or more plasma doping steps. Thus, for such processing, the substrates may be transferred to another holding device, an example of which is often referred to as a front opening unified pod, or "FOUP." The FOUP may be part of a substrate handling system that manipulates the individual substrates and subjects the substrates to one or more processing steps.

Figure 2:
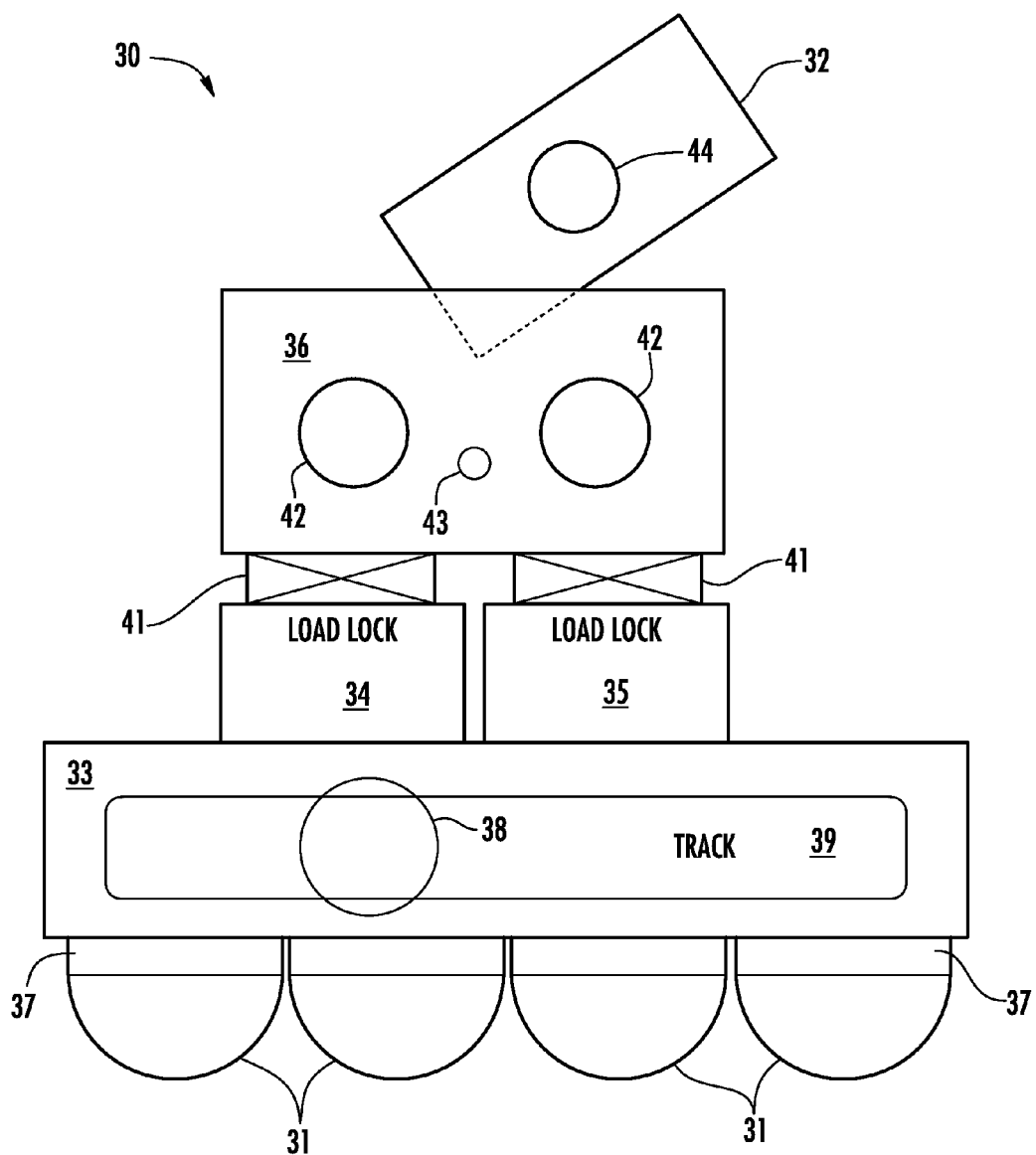
FIG. 2 is a schematic diagram of an exemplary substrate handling system.

FIG. 2 shows an exemplary substrate handling system 30 in which a plurality of FOUPs 31 each can hold a plurality of substrates. The substrates are transferred from the FOUPs 31 to a process chamber 32 via a buffer chamber 33, load locks 34 and 35 and a wafer handler chamber 36. Pod doors 37 interface the between the FOUPs 31 and the buffer chamber 33 so that substrates can pass between the FOUPs 31 and buffer chamber 33. In buffer chamber 33, an atmospheric robot 38 transports wafers along a track 39 to move wafers between the FOUPs 31 and load locks 34 and 35. The buffer chamber 33 may be at or near atmospheric pressure, and provides a controlled, low particulate environment. The load locks 34 and 35 communicate with substrate handler chamber 36 through isolation valves 40 and 41, respectively. The substrate handler chamber 36 may include one or more vacuum robots 42 and a substrate alignment station 43. A substrate is transferred by one of the robots 42 from one of the load locks 34, 35 to substrate alignment station 43. The substrate then is transferred to a process station 44 in process chamber 32 for processing, such as by ion implantation. The same process is reversed to transfer the substrate back to one of the FOUPs.

Figure 3:
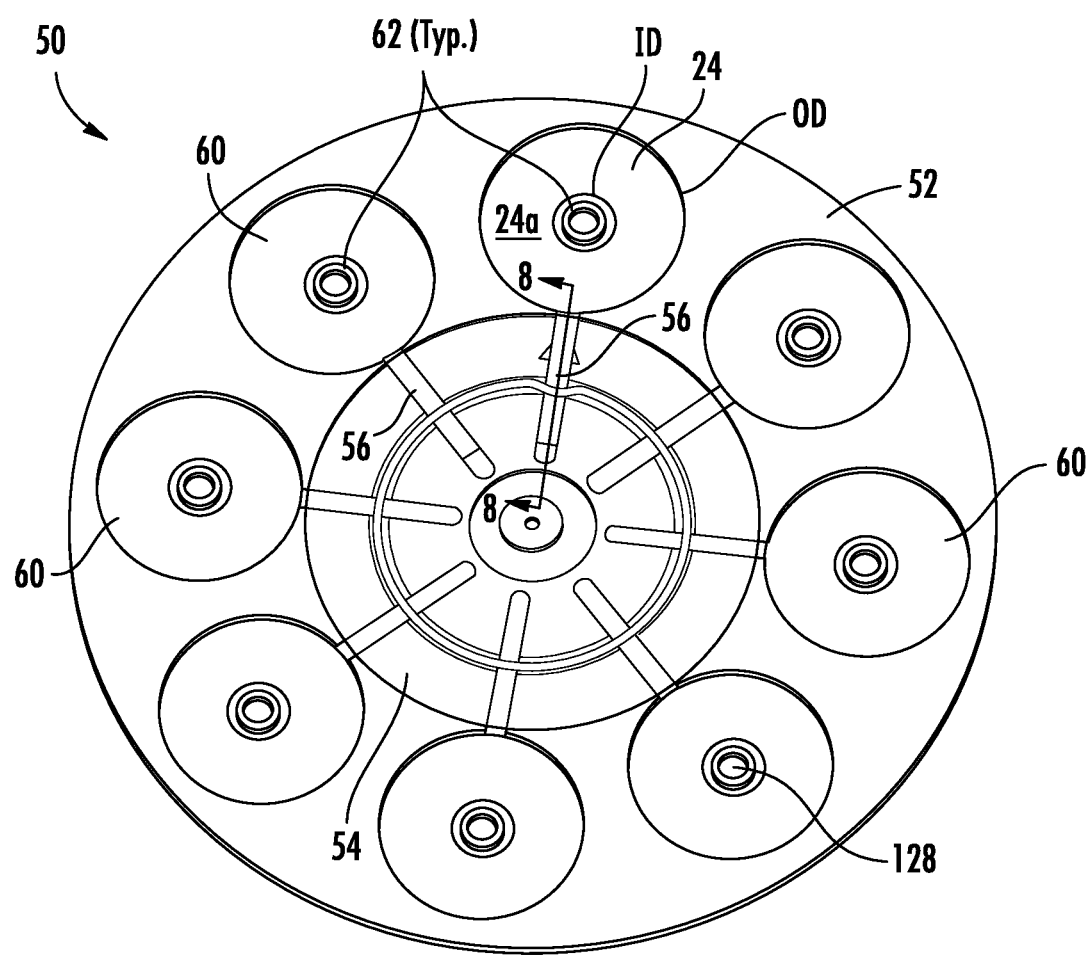
FIG. 3 is a perspective view of the disclosed substrate carrier engaged with a single substrate.

FIG. 3 shows an exemplary carrier 50 for use in holding a plurality of substrates 24. In one embodiment, the carrier 50 is loaded into a FOUP so that the substrates 24 may be subjected to one or more processing steps such as ion implantation, plasma doping, and the like. The carrier 50 can comprise a generally planar disk-shaped arrangement, which holds a plurality of substrates 24 having an ID, an OD and a face 24a that will be subject to one or more processing steps while being held in the carrier 50. As will be described in greater detail later, the carrier 50 is arranged so that each substrate 24 is contacted only along the ID and/or OD such that contact with the substrate faces is avoided. As will be appreciated, this ensures that no damage to the substrate faces will occur during the carriage process.

The carrier 50 may include a carrier plate 52, a cover plate 54, a plurality of movable substrate supports 56, and a plurality of springs 58 (see FIG. 8) associated with the substrate supports. The movable substrate supports 56 are retractable (against the bias of an associated spring 58) so that a substrate can be loaded into a carrier plate recess 60. Once a substrate 24 is received in a recess 60, the substrate support 56 is released so that it contacts the OD of the substrate 24, locking the substrate in place in the recess 60. As will be described in greater detail later, each substrate 24 is held in place using three points of contact along the substrate OD, the carrier plate 52 providing two points of contact and the substrate support 56 providing a third point of contact.

In the illustrated embodiment, the recesses 60 are generally circular, having a bottom surface 61, and a central protrusion 62 that fits within the ID of an associated substrate 24. As will be described in greater detail later, the protrusion 62 does not support the substrate, but instead can be used as a centering device to ensure that the substrate it is held in a desired orientation with respect to the recess 60 as the substrate support 56 is being released.

Figure 4:
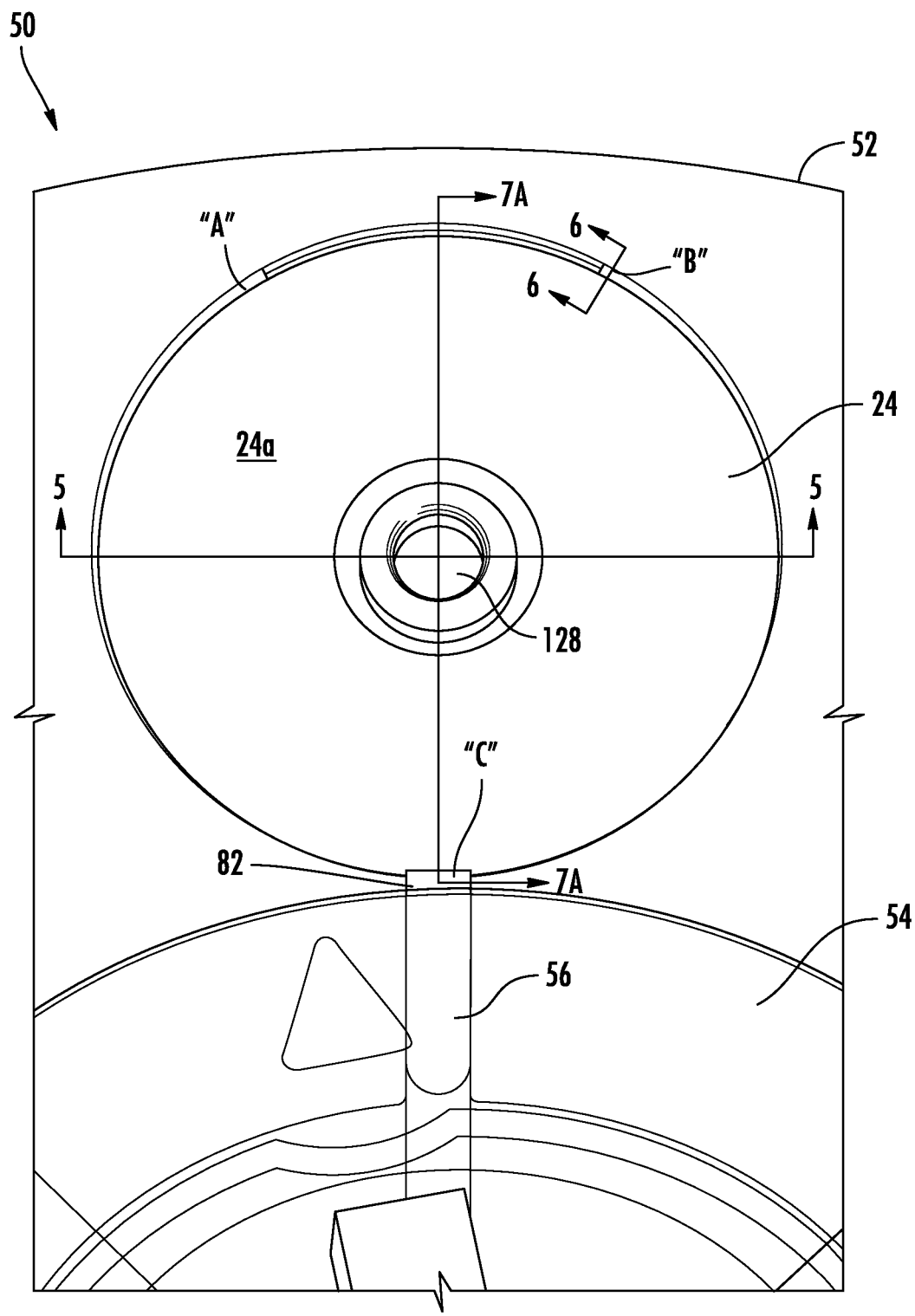
FIG. 4 is a detail view of the device of FIG. 3 showing engagement between the disclosed substrate carrier and a single substrate.

FIG. 4 shows the interaction between the carrier 50 and a single substrate 24. As noted, the substrate is supported at three points, the first two points "A" and "B" being located on the perimeter of the carrier recess 60, and the third point "C" being located on the movable substrate support 56.

Figure 5:
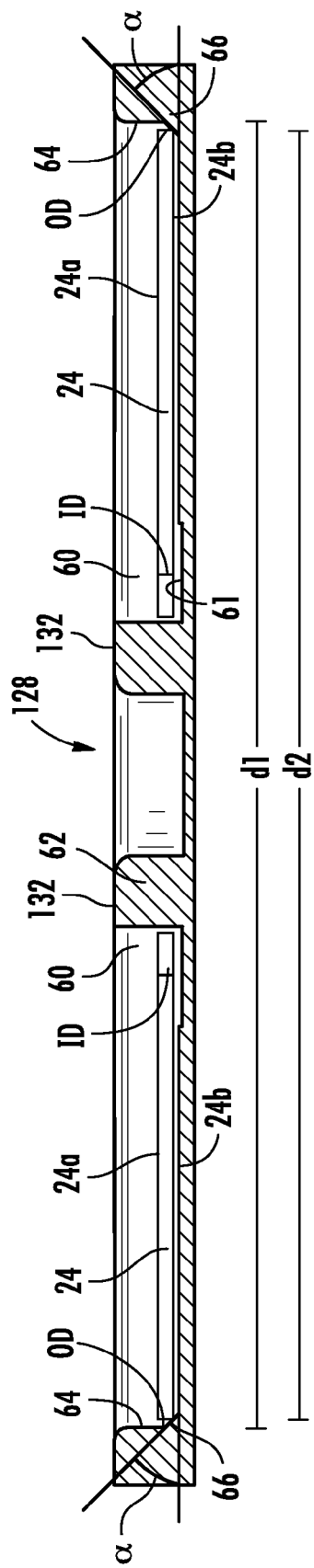
FIG. 5 is a cross-section view of the disclosed substrate carrier of FIG. 3 taken along line 4-4 of FIG. 4.

FIG. 5 illustrates the profile of one of the recesses 60, which may include a generally circular sidewall 64 having a diameter "d1" that is greater than the OD of the substrate 24. The sidewall 64 may include a lower beveled portion 66 disposed directly adjacent to the bottom surface 61 of the recess 60. As can be seen, the lower beveled portion 66 may have a diameter "d2" that is less than the OD of the substrate 24. This arrangement ensures that the substrate lower face 24b will not contact the bottom surface 61 of the recess 60, even if the substrate is incorrectly loaded into the carrier 50, or in the event of a dropped substrate. The beveled portion 66 may form a bevel angle alpha $\alpha$ with respect to the bottom surface 61 of the recess 60. In one embodiment, the bevel angle $\alpha$ is greater than a chamfer angle on the associated substrate 24 (where the substrate has a chamfered OD. Thus, where the chamfer angle on the substrate 24 is about 45 degrees on each edge, the bevel angle $\alpha$ is about 80 degrees. This arrangement can prevent the substrate face 24b from contacting the bottom surface 61 of the recess.

Figure 6:
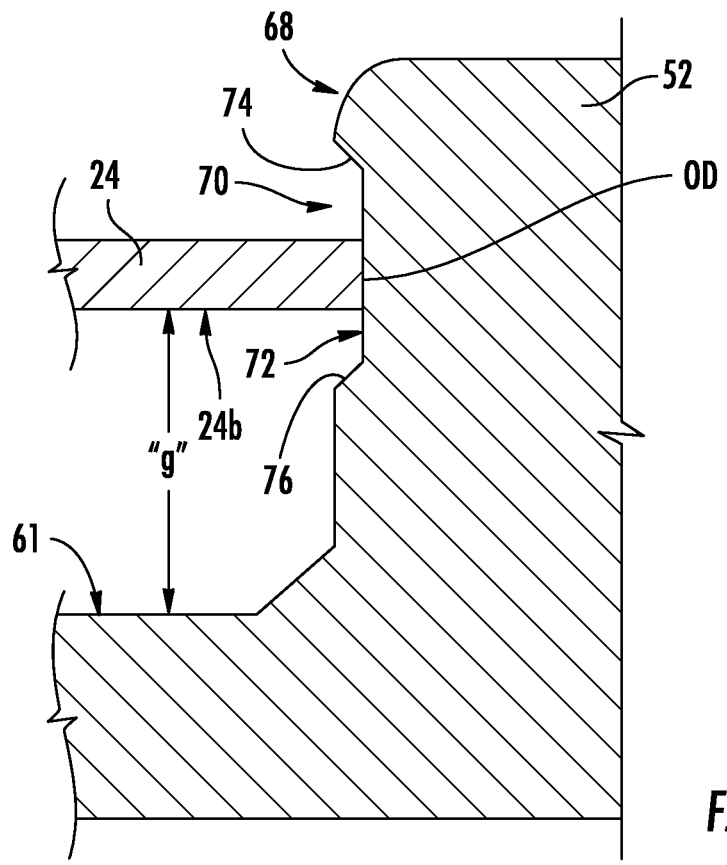
FIG. 6 is a cross-section view of the disclosed substrate carrier of FIG. 3, taken along line 5-5 of FIG. 4.
Figure 7B:
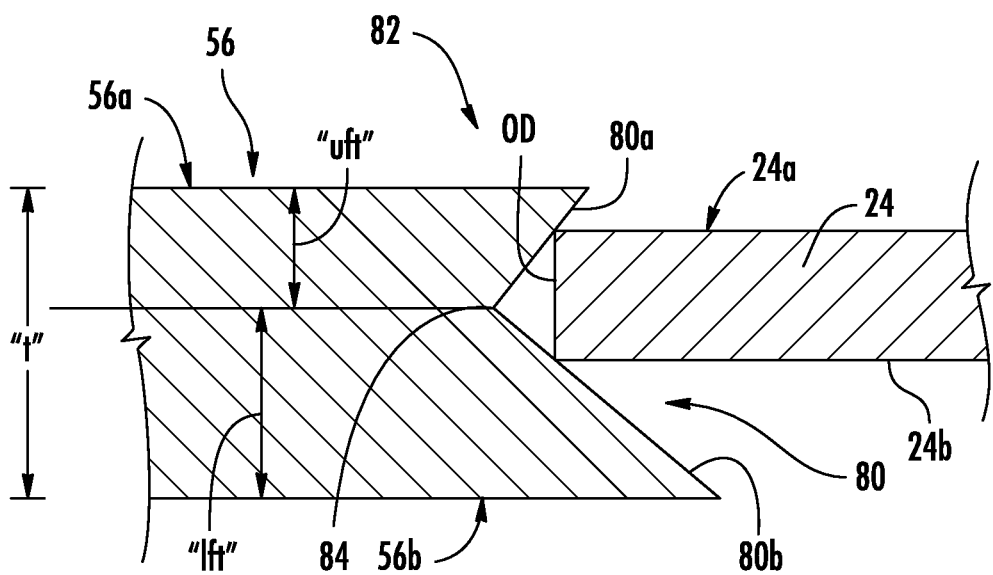

FIG. 6 shows the interaction between the substrate OD and the carrier 50 at point of contact "B." As can be seen, substrate 24 engages the carrier 50 at the substrate OD, which suspends the substrate lower face 24b above the bottom surface 61 of the recess 60 by a gap "g." As previously noted, suspending the substrate above the recess bottom minimizes the chance that damage to the substrate faces 24a, 24b can occur. In one embodiment, point of contact "B" is a protrusion 68 disposed on the side wall 64 of the recess 60. The protrusion 68 extends inward, away from the sidewall 64, and may include an inset portion 70 that receives the OD of the substrate 24 along an inset surface 72. The inset surface 72 has upper and lower bevels 74, 76 that act to lock the substrate 24 in place along the inset surface 72, ensuring that the substrate cannot slide up or down with respect to the carrier 50 once it is locked in place. It will be appreciated that the arrangement of point of contact "A" can be the same as that described in relation to point of contact "B."

Figure 7A:
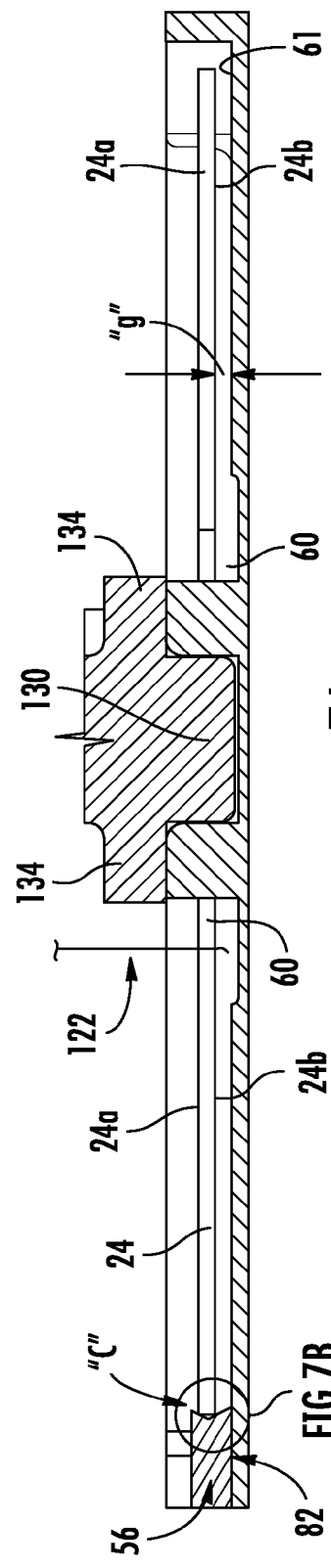
FIG. 7A is a cross-section view of the interaction between the substrate carrier recess and an exemplary substrate, taken along line 7A-7A of FIG. 4.
Figure 7B:
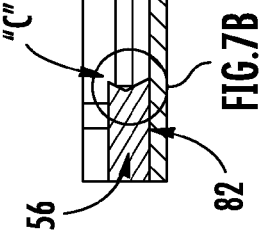
FIG. 7B is a detail view showing the interaction between the movable substrate support and the substrate.

FIGS. 7A and 7B show the third point of contact "C" for the substrate 24 which is facilitated by the movable substrate support 56. The movable substrate support 56 may include a support recess 80 disposed at a first end 82 of the support 56. The support recess 80 may include first and second angled recess surfaces 80a, 80b. The angling of the recess surfaces 80a, 80b ensures that the substrate 24 is engaged about the OD and not on either the upper or lower face 24a, 24b. As previously noted, this ensures that the substrate faces will not be damaged by the movable substrate support 56. In the illustrated embodiment, the fork 84 of the support recess 80 is offset from the midpoint of the thickness "t" of the movable substrate support 56 such that the distance from the upper surface 56a of the support to the fork 84 (identified as "uft") is less than the distance form the lower surface 56b of the support to the fork (identified as "lft"). This arrangement ensures that the desired gap "g" (FIG. 7A) will be maintained between the substrate 24 and the bottom surface 61 of the recess 60. Although the OD of the substrate 24 is shown in the figures as being completely flat, it will be appreciated that the disclosed arrangement functions equally well with substrates having beveled or rounded ODs. That is, the support recess 80 of the movable substrate support 56 and the inset portions 70 of protrusions 68 will contact only the OD of such beveled or rounded edge substrates, and will not contact with the substrate faces 24a, 24b.

Figure 8:
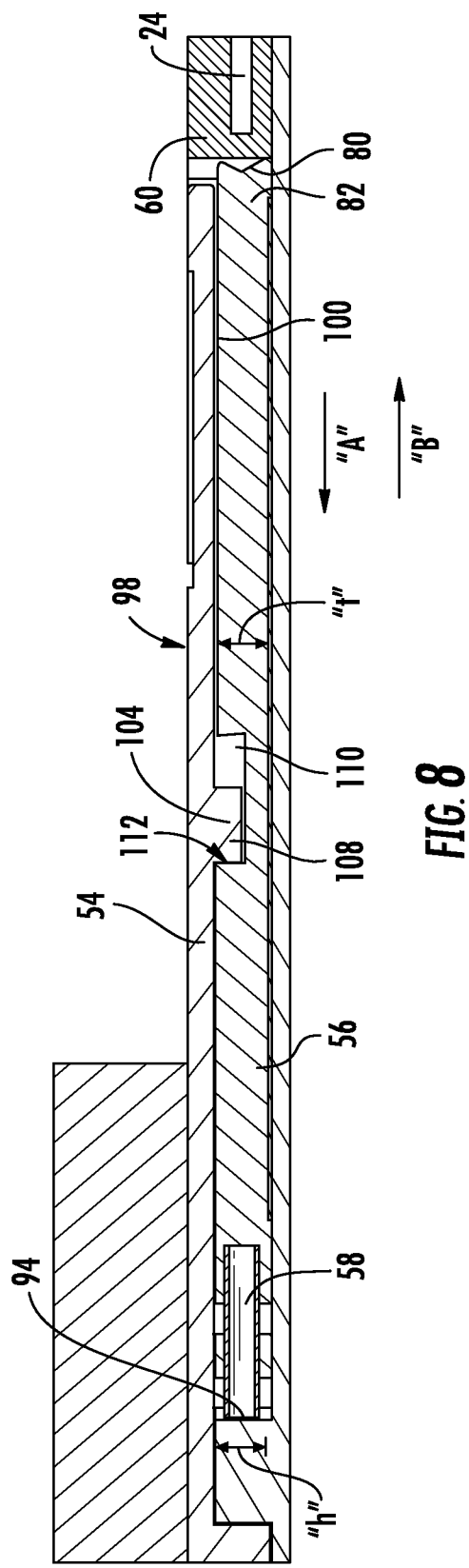
FIG. 8 is a cross-section view of the disclosed substrate carrier of FIG. 3, taken along line 8-8 of FIG. 3.

FIG. 8 shows the actuation mechanism for one of the plurality of movable substrate supports 56. In general, to load a substrate 24 onto the carrier 50, the movable substrate support 56 is retracted (i.e., moved in the direction of arrow "A") such that the first end 82 of the support is withdrawn from the associated carrier recess 60, or at least moved far enough that the support recess 80 does not interfere with the substrate 24. Once the substrate 24 is placed in the carrier recess 60, the movable substrate support 56 is moved toward the substrate (i.e., in the direction of arrow "B") until the support recess 80 engages the OD of the substrate. In one embodiment, the movable substrate support 56 is biased into engagement with the substrate 24 by spring 58. The spring 58 can be a coil spring, or other appropriate biasing arrangement. As will be appreciated, the spring 58 provides a force appropriate for supporting the substrate 50 against the inset portions 70 of the protrusions 68 in the carrier sidewall 64, thus keeping the substrate face 24b above the bottom surface 61 of the carrier recess 61.

Figure 9:
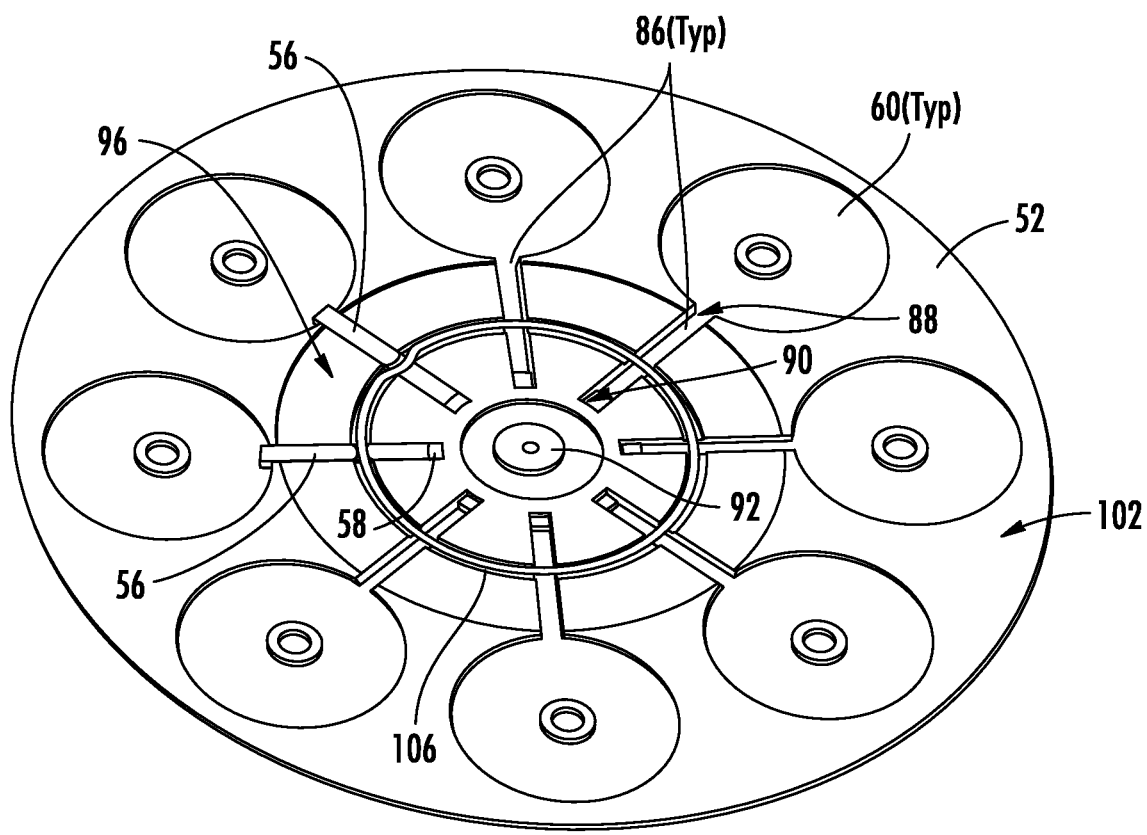
FIG. 9 is a perspective view of an exemplary carrier plate portion of the disclosed substrate carrier.

FIG. 9 shows an exemplary carrier plate 52 with the cover plate 54 removed to show the interaction between the carrier plate and the movable support members 56. The carrier plate 52 may include a plurality of slots 86 configured to slidingly receive respective movable support member 56. The slots 86 are oriented radially and are aligned so that a first end 88 is disposed directly adjacent to a respective recess 60 and a second end 90 is disposed adjacent to a hub recess 92 of the carrier plate. The slots 86 may each have an end wall 94 (see FIG. 8), and an associated spring 58 may be disposed against this end wall to bias the support member 56 toward the respective recess 60. The height "h" (see FIG. 8) of each slot 86 may be the same, or slightly greater than, the thickness "t" of the associated support member 56 such that when the support member is received within the slot and the cover plate 54 is fit to the carrier plate 52, the support member is captured within the slot.

Figure 10:
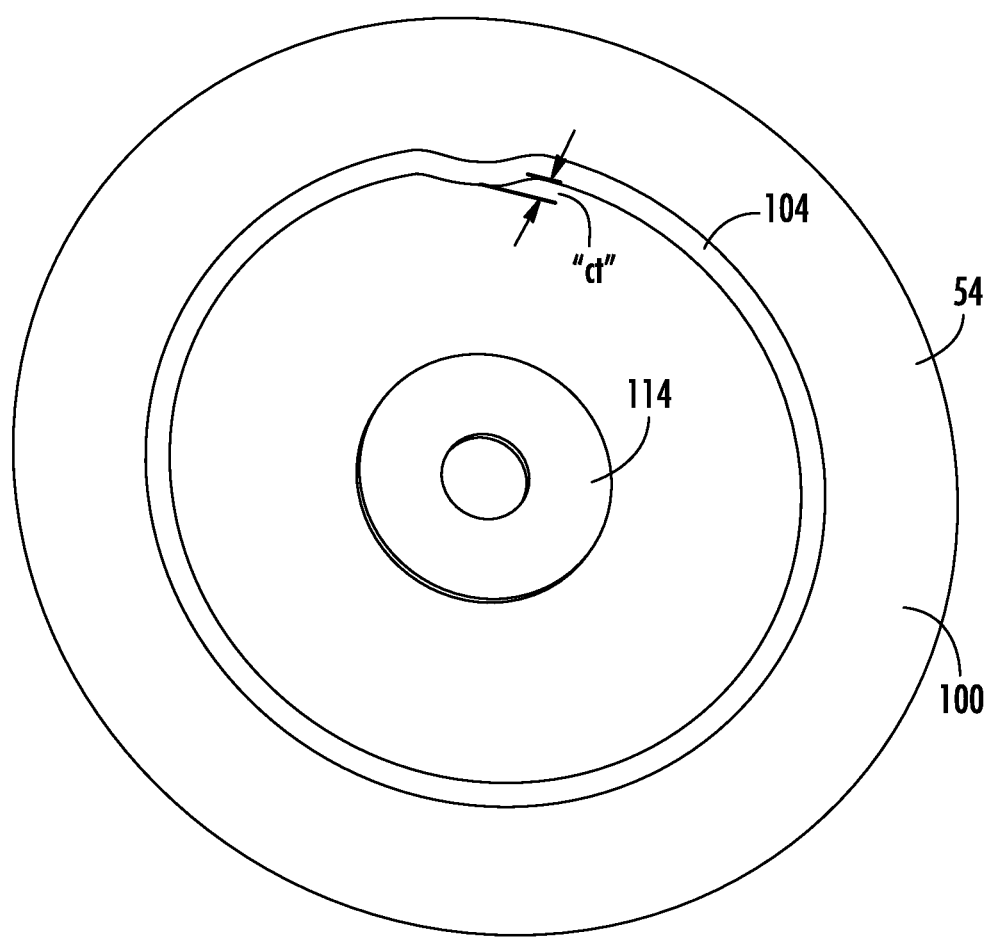
FIG. 10 is a reverse perspective view of an exemplary cover plate portion of the disclosed substrate carrier.

The carrier plate 52 may include a circular cover plate recess 96 configured to receive the cover plate 54, which is shown in greater detail in FIG. 10. The cover plate 54 may comprise a generally circular plate having upper and lower surfaces 98, 100. The cover plate 54 and the cover plate recess 96 may be sized and configured so that the upper surface 98 of the cover plate is flush with an upper surface 102 of the carrier plate 52 when the carrier 50 is fully assembled.

The lower surface 100 of the cover plate 52 may include a circumferential cam ring 104 that is received within a cam recess 106 in the carrier plate 52. The cam ring 104 and cam recess 106 are sized and configured so that the cam ring 104 can slide within the cam recess 106 as the cover plate 52 is rotated with respect to the carrier plate 52. The cam ring 104 may have a discrete radially inwardly projecting cam 108 disposed in a discrete location on the cam ring 104. The cam 108 may project radially inward by a distance "ct." Referring again to FIG. 8, the cam 108 may be configured to interact with an actuation recess 110 formed in the associated movable support member 56. The actuation recess 110 may be a laterally oriented notch formed in the movable support member such that as the cover plate 54 is rotated (along with the cam ring 104 and cam 106), the cam 106 engages a side surface 112 of the support member and forces it radially inwardly along the slot 86 (in the direction of arrow "A") against the bias of associated spring 58. As will be understood, this causes the support member 56 to retract from the associated recess 60, which clears the recess to receive a substrate 24. Once the substrate 24 has been placed within the recess, the cover plate 54 can be rotated so that cam 106 rotates out of engagement with the side surface 112 of the support member actuation recess 110. This, in turn, enables the spring 58 to move the support member 56 radially outwardly (in the direction of arrow "B") so that the support recess 80 of the support member 56 engages the OD of the substrate 24, locking the substrate within the recess 60. The cam 106 can "actuate" each movable support member 56 in sequence, thus enabling the carrier 50 to be loaded with a plurality of substrates in a serial manner.

The cover plate 54 can have a hub portion 114 that is received within hub recess 92 of the carrier plate 52. A fastener (not shown) can be used to secure the two together in a manner that fixes them axially together, but which enables them to rotate freely with respect to each other. A spanner or other tool may be used to engage the cover plate 54 in a known manner to enable selective rotation of the cover plate 54 with respect to the carrier plate 52 so that one or more substrates 24 can be loaded into the carrier 50.

It will be appreciated that the cover plate 54 can alternatively be provided with a plurality of cams 106 so that all of the support members 56 can be retracted and released simultaneously. This would be useful for applications in which the carrier 50 is automatically loaded with a plurality of substrates at once.

Figure 11:
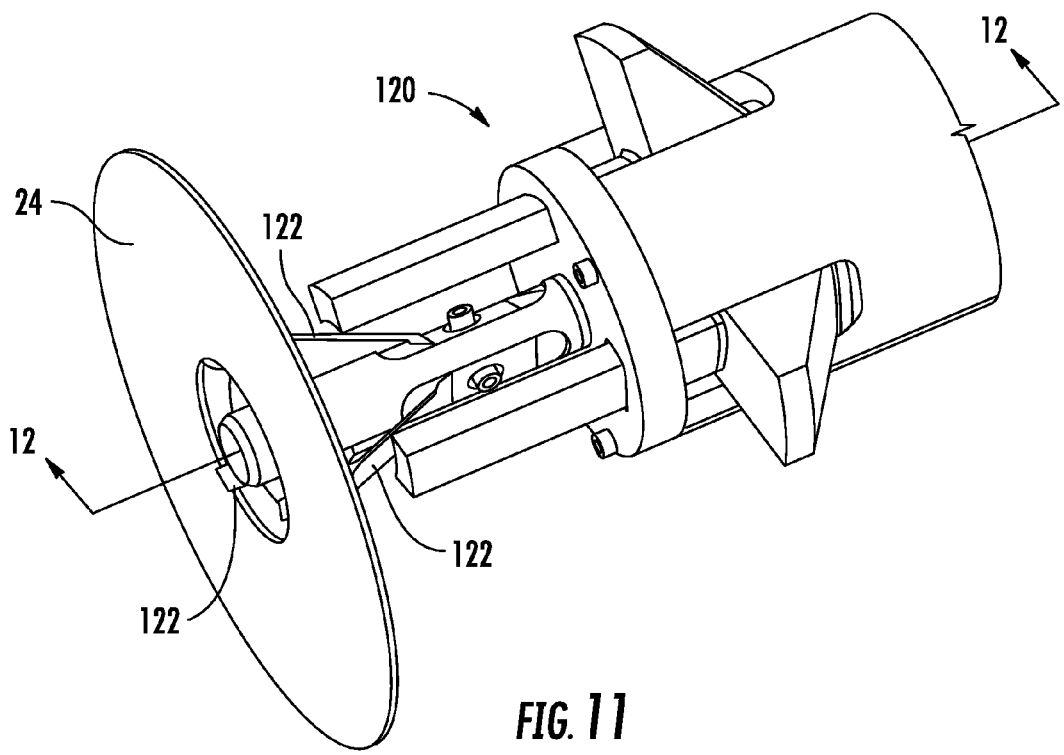
FIG. 11 is a perspective view of an exemplary substrate holder for use with the carrier of FIG. 3.
Figure 12:
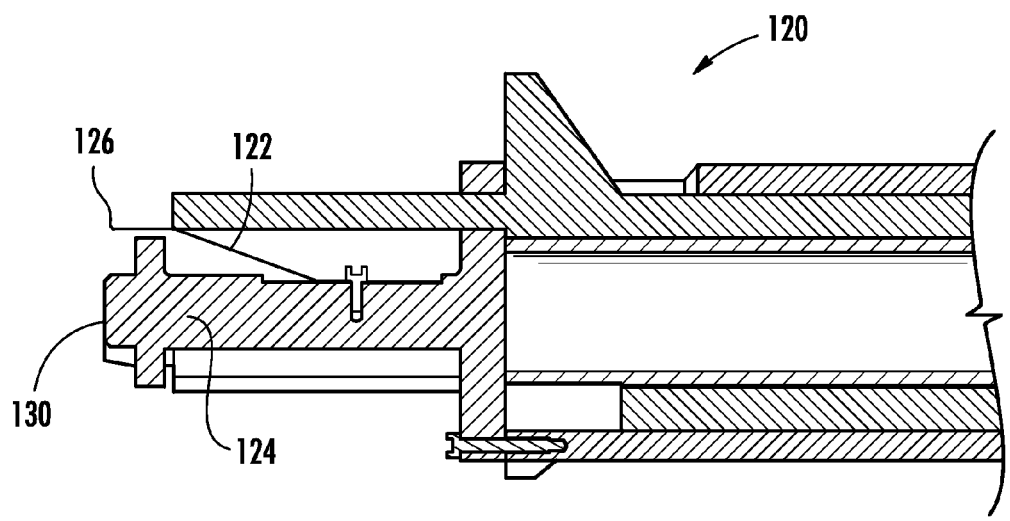
FIG. 12 is a cross-section view of the holder of FIG. 10, taken alone line 12-12 of FIG. 10.

Referring now to FIGS. 11 and 12, an exemplary holder 120 is shown for use in engaging a substrate 24 with the carrier 50 prior to processing. The holder 120 may also be used to remove one or more substrates from the carrier subsequent to processing. As will be explained, the carrier 50 and holder 120 may include complementary features that enable the holder 120 to precisely align with the carrier 50 to facilitate a desired handoff of a substrate 24 between the two. The holder 120 may engage the substrate on the ID so that positive engagement of the substrate is ensured, while contact with the substrate faces 24a, b is avoided. Thus, the holder 120 may include a plurality of substrate supports 122 positioned about an alignment shaft 124. The substrate supports 122 and alignment shaft 124 can be inserted through the ID of the substrate 24 in a retracted configuration (shown in FIG. 12), and then adjusted to an expanded configuration in which the supports 122 engage the ID of the substrate 24 (shown in FIG. 11). Distal portions 126 of the substrate supports 122 may have a cup-shape so that they can positively retain the ID of the substrate 24 when the holder is in the expanded configuration. The holder 120 can be adjusted between the retracted and expanded configurations manually or automatically. An example of the disclosed holder 120 is disclosed in related U.S. patent application Ser. No. 13/268,139, which is now U.S. Pat. No. 8,550,520, the entirety of which is incorporated herein by reference.

Figure 13:
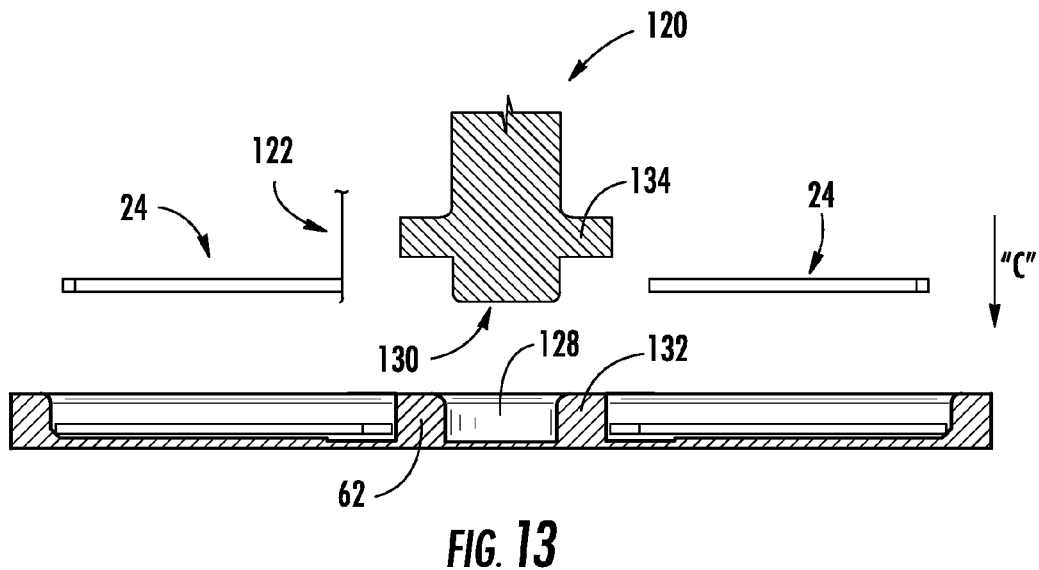
FIGS. 13-15 are a series of cross-section views illustrating an exemplary operation of the substrate holder of FIG. 11 loading a substrate onto the disclosed substrate carrier.

The holder 120 and carrier 50 may have complementary features to enable the holder 120 to align precisely with the carrier 50 and the substrate 24. These complementary features ensure a smooth handoff of the substrate 24 between the two, minimizing the chance for damage to the substrate. Referring now to FIG. 13, the carrier 50 may include an alignment recess 128 disposed within the protrusion 62. The alignment recess 128 may be a cylindrical recess configured to receive a nose portion 130 of the alignment shaft 124 of the holder 120 (see FIGS. 5 and 7A). In addition, a top surface 132 of the protrusion 62 may engage a shoulder 134 of the nose portion 130. These features enable the holder 120 to positively engage the carrier 50 to ensure proper repeatable axial and radial alignment of the holder 120 and the carrier 50 to facilitate transfer of the substrate 24 therebetween.

Figure 14:
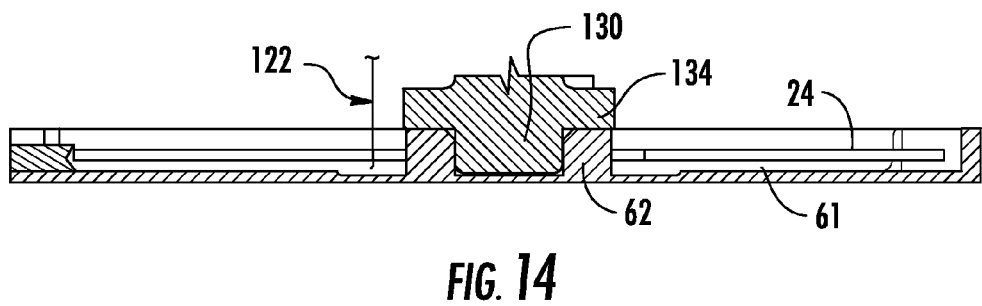
Figure 15:
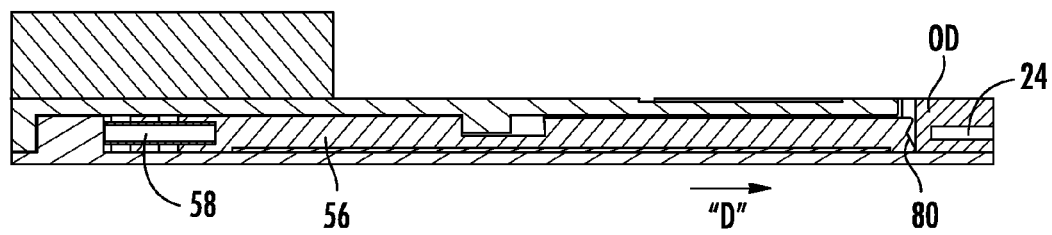

In operation, to transfer a substrate to the carrier, the movable substrate support 56 of a targeted recess 60 may be retracted by rotating the cover plate 54 in the previously described manner. The holder 120 (and attached substrate 24) may then be positioned over the targeted recess 60 such that the nose portion 130 of the holder 120 is aligned with the associated protrusion 62 (see FIG. 13). The holder 120 may then be moved in the direction of arrow "C" until the nose portion 130 is inserted in the alignment recess 128 of the protrusion until the shoulder 134 contacts the top surface of the protrusion 132 (see FIG. 14). At this point, the substrate 24 is held at a desired level above the bottom surface 61 of the recess 60 by the substrate supports 122. The cover plate 54 may then be rotated until the cam 108 disengages from the movable substrate support 56, enabling the spring 58 to move the support recess 80 of the movable substrate support 56 in the direction of arrow "D" (see FIG. 15) so that it engages the OD of the substrate 24. As previously noted, the movable substrate support presses the substrate 24 into engagement with the inset portions 70 of protrusions 68, locking the substrate to the carrier 50. The holder 120 may then be configured to the retracted position so that the substrate supports 122 disengage from the ID of the substrate 24. The holder may then be removed. Though the reverse process will not be described in detail, it will be appreciated that the substrate 24 may be removed from the carrier 50 according to a reverse sequence of the previously described steps.

The carrier 50 and its components can be constructed from any of a variety of materials, including graphite, metal, polymer and combinations thereof. Because the carrier 50 can be subject to the ion beam associated with implant processes, it may be desirable to provide a metal free carrier. The springs 58 may be metal, but these pieces will not be subject to the ion beam because they are disposed under the cover plate 54 in use. In some embodiments, a non-marring material rated to the flammability standards of UL 94-V0 may be used. In one exemplary embodiment, the carrier plate 52, cover plate 54 and movable substrate supports 56 are constructed of polyetheretherketone (PEEK).

Figure 16:
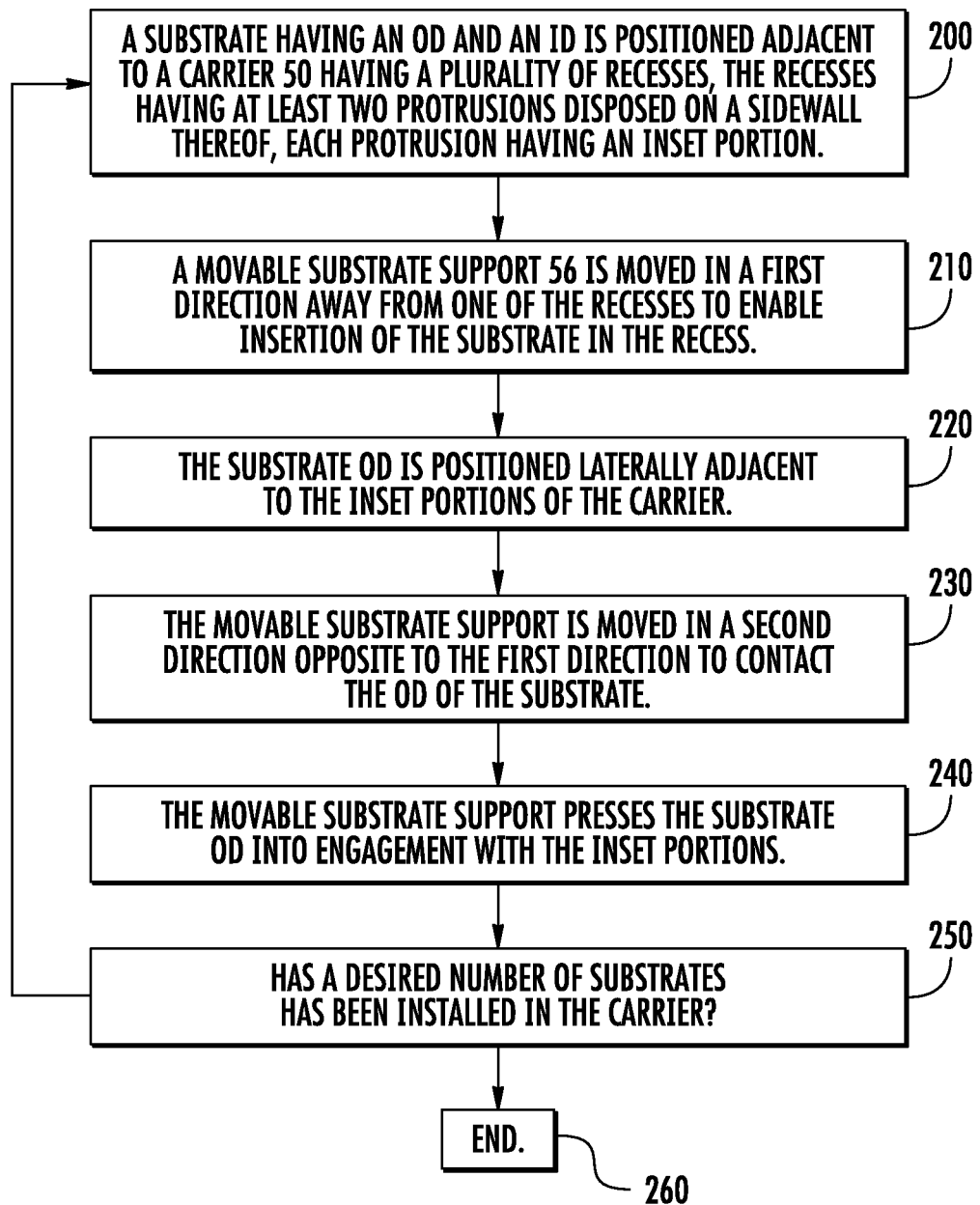
FIG. 16 is an exemplary logic flow implementing an embodiment of the disclosed method.

An exemplary logic flow will now be described in relation to FIG. 16. At step 200, a substrate 24 having an OD and an ID is positioned adjacent to a carrier 50 having a plurality of recesses 60, the recesses having at least two protrusions 68 disposed on a sidewall thereof, each protrusion having an inset portion 72. At step 210, a movable substrate support 56 is moved in a first direction to enable insertion of the substrate in the recess. At step 220, the OD of the substrate is positioned laterally adjacent to the inset portions. At step 230, the movable substrate support is moved in a second direction opposite to the first direction to contact the OD of the substrate. At step 240, the movable substrate support presses the substrate OD into engagement with the inset portions 72. At step 250, a determination is made whether a desired number of substrates has been installed in the carrier 50. If the answer is yes, then at step 260 the method ends. If the answer is no, then the process returns to step 200.

Some embodiments of the disclosed device may be implemented, for example, using a storage medium, a computer-readable medium or an article of manufacture which may store an instruction or a set of instructions that, if executed by a machine, may cause the machine to perform a method and/or operations in accordance with embodiments of the disclosure. Such a machine may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory (including non-transitory memory), removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A substrate carrier for carrying a substrate having an outside diameter (OD), and first and second substrate faces, comprising:
   a carrier plate having a substrate recess, a cover plate recess and a substrate support slot, the substrate recess having a protrusion on a recess sidewall, the protrusion including an inset portion;
   a cover plate rotatably disposed in the cover plate recess;
   a substrate support slidably disposed in the substrate support slot, the substrate support having a substrate engaging end and an actuation end; and
   a spring disposed between the actuation end of the substrate support and an end wall of the substrate support slot to bias the substrate support toward the recess;
   wherein the substrate engaging end and the inset portion of the protrusion are configured to engage the OD of the substrate to lock the substrate within the recess.

2. The substrate carrier of claim 1, the cover plate further comprising a cam ring including a radially inwardly oriented cam, the carrier plate further comprising a cam ring recess for receiving the cam ring therein, and the substrate support further comprising a laterally oriented slot;

wherein rotating the cover plate engages the cam with a side surface of the laterally oriented slot to thereby move the substrate support radially inward along the substrate support slot, compressing the sprint and retracting the substrate engaging end away from the substrate recess.

3. The substrate carrier of claim 2, wherein the side surface of the laterally oriented slot is rounded to provide a rounded engagement surface for interacting with the cam.

4. The substrate carrier of claim 1, wherein the substrate engaging end comprises a notch having first and second angled notch surfaces for engaging the substrate along the substrate OD.

5. The substrate carrier of claim 4, wherein the substrate recess has first and second protrusions disposed on the recess sidewall, the first and second protrusions each including an inset portion, and wherein the notch and the inset portions of the first and second protrusions are configured to engage the substrate OD to retain the substrate at a predetermined distance above a bottom surface of the recess.

6. The substrate carrier of claim 1, wherein the recess sidewall has a lower bevel portion disposed adjacent a bottom surface of the recess.

7. The substrate carrier of claim 1, wherein the substrate engaging end comprises a notch having first and second angled notch surfaces that meet at a fork, the fork located closer to an upper surface of the substrate support than to a lower surface of the substrate support to retain the substrate at a predetermined distance above a bottom surface of the recess.

8. The substrate carrier of claim 1, wherein the carrier includes:
a plurality of substrate recesses for receiving a plurality of substrates disposed in radial relation about the carrier;
a plurality of substrate supports slidably disposed in a plurality of respective substrate support slots, each of the substrate supports having a substrate engaging end and an actuation end;
a plurality of springs disposed between respective actuation ends of the plurality of substrate supports and end walls of respective substrate support slots to bias the plurality of substrate supports toward an associated substrate recess;
wherein the substrate engaging ends of the substrate supports are configured to engage the OD of a respective substrate to lock the respective substrate within the respective recess.

9. The substrate carrier of claim 8, wherein the cover plate comprises a cam ring including a radially inwardly oriented cam, and the plurality of substrate supports further each comprise a laterally oriented slot; wherein rotating the cover plate engages the cam with a side surface of the laterally oriented slot of a selected one of the plurality of substrate supports to thereby move the selected substrate support radially inward along the substrate support slot, retracting the substrate engaging end away from the associated substrate recess.

10. A substrate carrier for carrying a plurality of substrates having an outside diameter (OD), the substrate carrier comprising:
a carrier plate having a plurality of substrate recesses, each of said plurality of substrate recesses configured to engage one of the plurality of substrates along the OD of the substrate;
a cover plate rotatably engaged with said carrier plate; and
a plurality of substrate supports slidably disposed with respect to said carrier plate, each of said plurality of substrate supports having a substrate engaging end that is movable into an associated one of said plurality of substrate recesses to engage one of the plurality of substrates disposed therein.

11. The substrate carrier of claim 10, wherein the substrate engaging ends of the plurality of substrate supports are biased toward an associated one of said plurality of substrate recesses.

12. The substrate carrier of claim 10, the cover plate further comprising a cam ring including a radially inwardly oriented cam, wherein rotating the cover plate engages the cam with a surface of the laterally oriented slot to move the substrate support radially inwardly along a substrate support slot, thereby retracting the substrate engaging end away from the associated substrate recess.

13. The substrate carrier of claim 10, wherein the substrate engaging end of each of the plurality of substrate supports comprises a notch having first and second angled notch surfaces for engaging the associated substrate along the substrate OD.

14. The substrate carrier of claim 10, wherein each of the plurality of substrate recesses includes first and second protrusions disposed on a recess sidewall, the first and second protrusions each including an inset portion, wherein the substrate engaging end and the inset portions of the first and second protrusions are configured to engage the OD of an associated one of said plurality of substrates to retain the associated substrate at a predetermined distance above a bottom surface of the associated substrate recess.

* * * * *